United States Patent
Kamiya et al.

(10) Patent No.: US 9,152,159 B2
(45) Date of Patent: Oct. 6, 2015

(54) POWER SUPPLY CIRCUIT AND SEMICONDUCTOR DEVICE

(71) Applicant: FUJITSU SEMICONDUCTOR LIMITED, Yokohama-shi, Kanagawa (JP)

(72) Inventors: Kazuhiro Kamiya, Ayase (JP); Akihito Yoshioka, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 75 days.

(21) Appl. No.: 14/165,074

(22) Filed: Jan. 27, 2014

(65) Prior Publication Data

US 2014/0269136 A1  Sep. 18, 2014

(30) Foreign Application Priority Data

Mar. 18, 2013 (JP) ................. 2013-055461

(51) Int. Cl.

| G05F 1/575 | (2006.01) |
|---|---|
| G11C 5/14 | (2006.01) |
| G05F 1/565 | (2006.01) |
| G05F 1/56 | (2006.01) |
| G05F 1/46 | (2006.01) |

(52) U.S. Cl.
CPC ............... *G05F 1/575* (2013.01); *G05F 1/565* (2013.01); *G11C 5/14* (2013.01); *G11C 5/147* (2013.01); *G05F 1/467* (2013.01); *G05F 1/56* (2013.01)

(58) Field of Classification Search
CPC ....................................................... G05F 1/467
See application file for complete search history.

(56) References Cited

U.S. PATENT DOCUMENTS

| 5,917,313 | A * | 6/1999 | Callahan, Jr. ................. 323/288 |
| 6,201,375 | B1 * | 3/2001 | Larson et al. ................. 323/277 |
| 2004/0174149 | A1 * | 9/2004 | Agari et al. ................... 323/271 |
| 2005/0088153 | A1 * | 4/2005 | Suzuki .......................... 323/274 |
| 2006/0267673 | A1 * | 11/2006 | Gan et al. ..................... 327/540 |
| 2008/0018386 | A1 * | 1/2008 | Hitomi et al. ................. 327/541 |
| 2009/0079406 | A1 * | 3/2009 | Deng et al. .................... 323/280 |
| 2009/0273323 | A1 * | 11/2009 | Kimura ......................... 323/265 |
| 2010/0148742 | A1 * | 6/2010 | Nakashima ................... 323/288 |
| 2010/0156364 | A1 * | 6/2010 | Cho et al. ...................... 323/280 |
| 2010/0213913 | A1 * | 8/2010 | Shito ............................. 323/284 |
| 2010/0264896 | A1 * | 10/2010 | Tonomura ..................... 323/293 |
| 2011/0025280 | A1 * | 2/2011 | Kimura ......................... 323/282 |
| 2011/0175578 | A1 * | 7/2011 | Pagano ......................... 320/164 |

(Continued)

FOREIGN PATENT DOCUMENTS

| JP | 2004-062329 A | 2/2004 |
| JP | 2005-174208 A | 6/2005 |
| JP | 2010-191885 A | 9/2010 |

*Primary Examiner* — Timothy J Dole
*Assistant Examiner* — Yusef Ahmed
(74) *Attorney, Agent, or Firm* — Arent Fox LLP (57) ABSTRACT

An output transistor coupled between an input terminal where an input voltage is input and an output terminal where an output voltage is output; an error amplifier configured to generate a first error signal and a second error signal based on a voltage in accordance with the output voltage and a reference voltage, and to output the first error signal to a gate terminal of the output transistor; an anti-overshoot circuit coupled to the output terminal and controlled by the second error signal; an output transistor control part configured to add a control signal based on a first current in accordance with an AC component of the output voltage to the first error signal; and a sensitivity adjustment part configured to decrease the first current based on the second error signal when the output voltage is higher than a certain voltage.

9 Claims, 7 Drawing Sheets

(56) References Cited

U.S. PATENT DOCUMENTS

| | | | |
|---|---|---|---|
| 2012/0105047 A1* | 5/2012 | Huang et al. | 323/351 |
| 2012/0126858 A1* | 5/2012 | Senda et al. | 327/108 |
| 2012/0242312 A1* | 9/2012 | Heng | 323/282 |
| 2013/0093505 A1* | 4/2013 | Gupta et al. | 327/540 |
| 2013/0113447 A1* | 5/2013 | Kadanka | 323/280 |
| 2013/0113454 A1* | 5/2013 | Chen et al. | 323/312 |
| 2013/0134954 A1* | 5/2013 | Yano et al. | 323/282 |
| 2013/0234689 A1* | 9/2013 | Notani | 323/282 |
| 2014/0077780 A1* | 3/2014 | Teong et al. | 323/282 |
| 2014/0217999 A1* | 8/2014 | Wibben et al. | 323/282 |

\* cited by examiner

POWER SUPPLY CIRCUIT AND SEMICONDUCTOR DEVICE

CROSS-REFERENCE TO RELATED APPLICATION

This application is based upon and claims the benefit of priority of the prior Japanese Patent Application No. 2013-055461, filed on Mar. 18, 2013, the entire contents of which are incorporated herein by reference.

FIELD

The embodiments discussed herein are directed to a power supply circuit and a semiconductor device.

BACKGROUND

In an on-chip regulator used as a power supply circuit supplying electric power to a microcontroller, a memory, and so on, there are requirements such as enabling low power consumption, a Cap-Free system (reduction of terminals, reduction of external components) in which an external capacitance is not attached. However, response properties of a linear regulator depend on a consumption current of a circuit, and therefore, a feedback loop becomes late caused by the lower power consumption, and it is difficult to follow variation of an output voltage. Besides, a variation amount of the output voltage increases resulting that the capacitance is not attached. Accordingly, in the linear regulator, if the low power consumption is enabled and the Cap-Free system is used, the response properties relative to variation of load deteriorate and a lot of time is required until the output voltage is stabled if, for example, the load steeply varies and the output voltage largely changes. As one of methods enabling a linear regulator in which the power consumption is lowered, the Cap-Free system is used, and stable voltage can be supplied, a method in which, for example, a control circuit controlling the output voltage is provided in addition to the feedback loop is proposed as illustrated in FIG. 8 (for example, refer to Patent Document 1).

Figure 8:
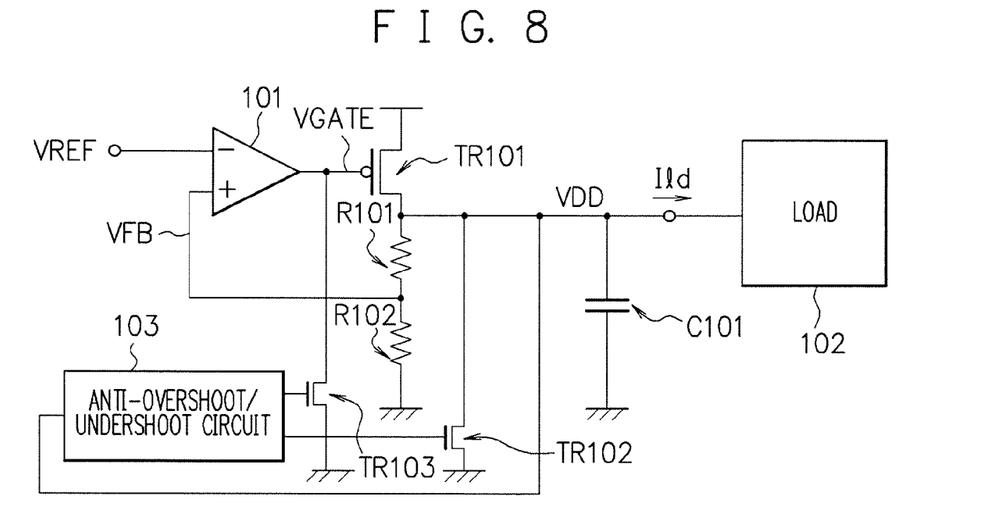
FIG. 8 is a view illustrating a configuration example of a conventional power supply circuit.

FIG. 8 is a view illustrating a configuration example of a conventional power supply circuit (linear regulator). The power supply circuit illustrated in FIG. 8 includes an error amplifier 101, an output transistor TR101 using a P-channel transistor, resistances R101, R102, a capacitance C101, an anti-overshoot/undershoot circuit 103, and transistors TR102, TR103. A load 102 is coupled to an output terminal of the power supply circuit. VREF is a constant reference voltage supplied from a not-illustrated reference voltage circuit, VDD is an output voltage of the power supply circuit, VGATE is a voltage supplied to a gate terminal of the output transistor TR101, VFB is a divided voltage generated by dividing the output voltage VDD at the resistances R101, R102 coupled in series.

In the power supply circuit illustrated in FIG. 8, when the divided voltage VFB in accordance with the output voltage VDD becomes lower than the reference voltage VREF, an output voltage of the error amplifier 101 decreases, and the voltage VGATE supplied to the gate of the output transistor TR101 decreases. As a result, an ON-resistance of the output transistor TR101 decreases, and the output voltage VDD increases. On the other hand, when the divided voltage VFB in accordance with the output voltage VDD is higher than the reference voltage VREF, the output voltage of the error amplifier 101 increases, and the voltage VGATE supplied to the gate of the output transistor TR101 increases. As a result, the ON-resistance of the output transistor TR101 increases, and the output voltage VDD decreases. The power supply circuit controls such that a constant voltage is output from the output terminal as the output voltage VDD as stated above.

Figure 9:
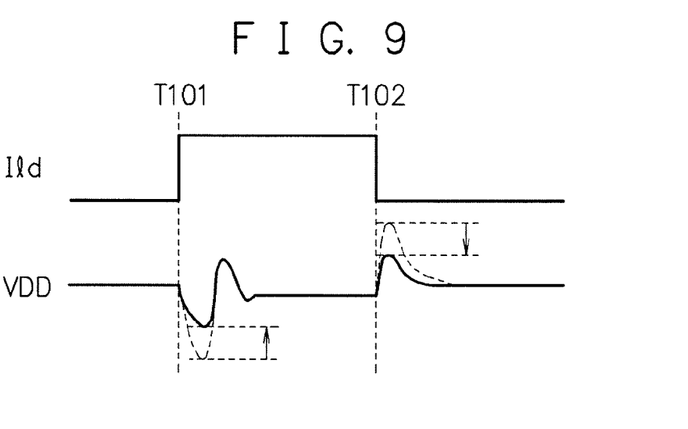
FIG. 9 is a view illustrating a change of an output voltage in accordance with variation of a load current.

Here, when a load current Ild to the load 102 varies, the output voltage VDD of the power supply circuit changes resulting from the variation of the load current Ild. For example, as illustrated in FIG. 9, the output voltage VDD of the power supply circuit decreases when the load 102 becomes heavy and the load current Ild steeply increases (time T101). Besides, the output voltage VDD of the power supply circuit increases when the load 102 becomes light and the load current Ild steeply decreases (time T102). To suppress the change of the output voltage resulting from the variation of the load current Ild as stated above, the anti-overshoot/undershoot circuit 103 monitors the output voltage VDD, and performs a control of the transistors TR102, TR103 in accordance with an AC component of the output voltage VDD in the power supply circuit illustrated in FIG. 8.

The anti-overshoot/undershoot circuit 103 suppresses a variation amount by setting the transistor TR102 in on-state (continuity state) to be decrease the output voltage VDD when the output voltage VDD is in an overshoot state. The anti-overshoot/undershoot circuit 103 suppresses the variation amount of the output voltage VDD by setting the transistor TR103 in on-state (continuity state) to decrease the voltage VGATE supplied to the gate of the output transistor TR101 when the output voltage VDD is in an undershoot state. The power supply circuit illustrated in FIG. 8 reduces the overshoot and undershoot of the output voltage VDD resulting from the steep variation of the load current to suppress the variation of the output voltage VDD as stated above.
[Patent Document 1] Japanese Laid-open Patent Publication No. 2010-191885

Figure 10:
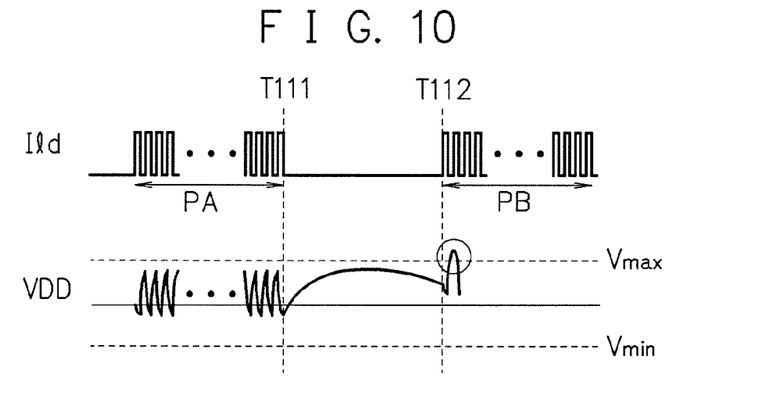
FIG. 10 is a waveform diagram illustrating an operation example of the conventional power supply circuit.

In the power supply circuit illustrated in FIG. 8, for example, when the load 102 is a memory, the load current Ild is generated when the memory actively operates such as writing of data to the memory and reading of data from the memory. As illustrated in FIG. 10, a case is considered when the writing and so on of data to the memory is repeatedly performed at a period PA, and thereafter, an interval period of times T111 to T112 elapses under a state in which the memory is not operated, then the writing and so on of data to the memory is repeatedly performed again at a period PB from the time T112.

The power supply circuit illustrated in FIG. 8 performs the control of the transistors TR102, TR103 in accordance with only the AC component of the output voltage VDD of the power supply circuit. Accordingly, as illustrated in FIG. 10, the load current Ild is repeatedly generated at the period PA, and thereafter, the load current Ild steeply disappears at the time T111, the output voltage VDD is overshot because a response of the power supply circuit by the feedback loop is late and the control of the output transistor TR101 delays.

If the memory is operated again at the time T112 when the output voltage VDD is overshot and at a high position, the transistor TR103 is in the ON-state (continuity state) to suppress the undershoot of the output voltage VDD resulting from the variation of the load current Ild. The output voltage VDD thereby increases for the same amount as a time when the output voltage VDD is at a steady state though the output voltage VDD of the power supply circuit is at the high position. As a result, the output voltage VDD exceeds an upper limit value Vmax of a power supply voltage range in which the load 102 is able to operate, and there is a possibility in which reliability problems such as operation failure and deterioration of operating life of a product are incurred.

Namely, there is a case when the output voltage VDD is overshot and exceeds the upper limit value Vmax of the power supply voltage range in which the load 102 can operate when the load operation periods in which the load current Ild is repeatedly generated are continuously repeated with a certain time interval in the conventional power supply circuit illustrated in FIG. 8.

SUMMARY

According to an aspect of the embodiments, a power supply circuit includes: a first transistor coupled between an input terminal where an input voltage is input and an output terminal where an output voltage is output; an error amplifier configured to generate a first error signal and a second error signal based on a difference voltage between a voltage in accordance with the output voltage and a reference voltage, and to output the first error signal to a gate terminal of the first transistor; a control circuit configured to add a control signal based on a first current in accordance with an AC component of the output voltage to the first error signal; and an adjustment circuit configured to decrease the first current based on the second error signal when the output voltage is higher than a certain voltage.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, an embodiment will be explained based on accompanying drawings.

Figure 1:
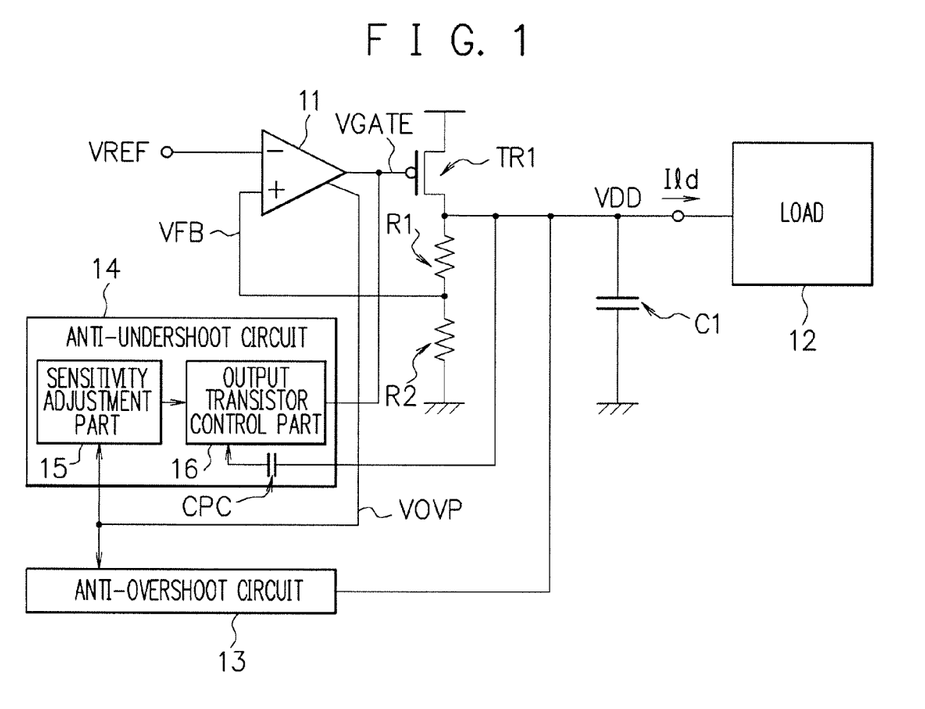
FIG. 1 is a view illustrating a configuration example of a power supply circuit according to an embodiment.

FIG. 1 is a view illustrating a configuration example of a power supply circuit according to an embodiment. The power supply circuit according to the present embodiment includes an error amplifier 11, an output transistor TR1, resistances R1, R2, a capacitance C1, an anti-overshoot circuit 13, and an anti-undershoot circuit 14. A load 12 is coupled to an output terminal of the power supply circuit, and a load current Ild is supplied from the power supply circuit to the load 12. The load 12 is, for example, a memory or a microcontroller.

A divided voltage VFB is input to a positive side input terminal, and a reference voltage VREF set in advance is input to a negative side input terminal of the error amplifier 11. The divided voltage VFB is a voltage in which an output voltage VDD output from the output terminal of the power supply circuit is divided and generated at the resistances R1, R2 coupled in series. The reference voltage VREF is a constant voltage supplied from, for example, a not-illustrated reference voltage circuit. The error amplifier 11 outputs a first error signal to a gate terminal of the output transistor TR1 and outputs a second error signal VOVP to the anti-overshoot circuit 13 and the anti-undershoot circuit 14, based on the reference voltage VREF and the divided voltage VFB in accordance with the output voltage VDD.

For example, a P-channel transistor is used as the output transistor TR1. In the output transistor TR1, a source terminal is coupled to an input terminal of the power supply circuit, and a drain terminal is coupled to the output terminal of the power supply circuit. Here, an input voltage is input to the input terminal, and an output voltage is output to the output terminal. A voltage VGATE obtained by adding a control signal based on a first current (additional current) output from the anti-undershoot circuit 14 to the first error signal output from the error amplifier 11 is supplied to the gate terminal of the output transistor TR1.

The resistances R1, R2 are coupled in series between the drain of the output transistor TR1 and a ground voltage. A voltage at a coupling point of the resistances R1, R2 is supplied to the error amplifier 11 as the divided voltage VFB. The capacitance C1 is coupled between the output terminal of the power supply circuit and the ground voltage. The anti-overshoot circuit 13 operates in accordance with the second error signal VOVP output from the error amplifier 11, and forcibly decreases the output voltage VDD when the output voltage VDD is excessively overshot.

The anti-undershoot circuit 14 adds the control signal based on the first current in accordance with an AC component of the output voltage VDD to the first error signal. The anti-undershoot circuit 14 outputs the additional current when the output voltage VDD decreases resulting from steep increase of the load current Ild, and thereby, decreases the voltage VGATE supplied to the gate terminal of the output transistor TR1 to suppress the undershoot of the output voltage VDD. The anti-undershoot circuit 14 includes a sensitivity adjustment part 15 and an output transistor control part 16.

The sensitivity adjustment part 15 adjusts sensitivity of the output transistor control part 16 relative to variation of the output voltage VDD based on the second error signal VOVP output from the error amplifier 11. The output transistor control part 16 generates the control signal based on the first current in accordance with the AC component of the output voltage VDD extracted by being intervened by a coupling capacitance CPC, and outputs the control signal to the gate terminal of the output transistor TR1. The sensitivity of the output transistor control part 16 relative to the variation of the output voltage VDD is adjusted by the sensitivity adjustment part 15, and is controlled to decrease the first current to be output when the DC component of the output voltage VDD (DC level) is higher than a certain voltage.

Next, operations of the power supply circuit according to the present embodiment are described. Basic operations of the power supply circuit according to the present embodiment illustrated in FIG. 1 are the same as a conventional power supply circuit. Namely, when the divided voltage VFB in accordance with the output voltage VDD becomes lower than the reference voltage VREF, an output voltage of the error amplifier 11 decreases, and the voltage VGATE supplied to the gate of the output transistor TR1 decreases. As a result, an ON-resistance of the output transistor TR1 decreases, and the output voltage VDD increases. On the other hand, when the divided voltage VFB in accordance with the output voltage VDD becomes higher than the reference voltage VREF, the output voltage of the error amplifier 11 increases, and the voltage VGATE supplied to the gate of the output transistor TR1 increases. As a result, the ON-resistance of the output transistor TR1 increases, and the output voltage VDD decreases. As stated above, the power supply circuit controls such that a constant voltage is output from the output terminal as the output voltage VDD.

In the power supply circuit according to the present embodiment, the anti-undershoot circuit 14 supplies the additional current to the gate terminal of the output transistor TR1 in accordance with the steep decrease (undershoot) of the output voltage VDD resulting from the increase of the load current Ild when the load current Ild to the load 12 steeply increases. The voltage VGATE supplied to the gate terminal of the output transistor TR1 decreases thereby to suppress the lowering of the output voltage VDD. In the present embodiment, the additional current supplied to the gate terminal of the output transistor TR1 is adjusted based on the second error signal VOVP output from the error amplifier 11, and the additional current to be output is decreased when the DC component (DC level) of the output voltage VDD is higher than the certain voltage. It is thereby possible to suppress the increase of the output voltage VDD caused by the additional current when the output voltage VDD is overshot and at the high position. Accordingly, it is possible to surely keep the output voltage VDD within a power supply voltage range in which the load 12 is able to operate, and to prevent that the output voltage VDD exceeds an upper limit value of the power supply voltage range in which the load 12 is able to operate. Besides, in the power supply circuit according to the present embodiment, the anti-overshoot circuit 13 decreases the output voltage VDD in accordance with the second error signal VOVP output from the error amplifier 11 to suppress the increase of the output voltage VDD when the output voltage VDD is excessively overshot.

Figure 2:
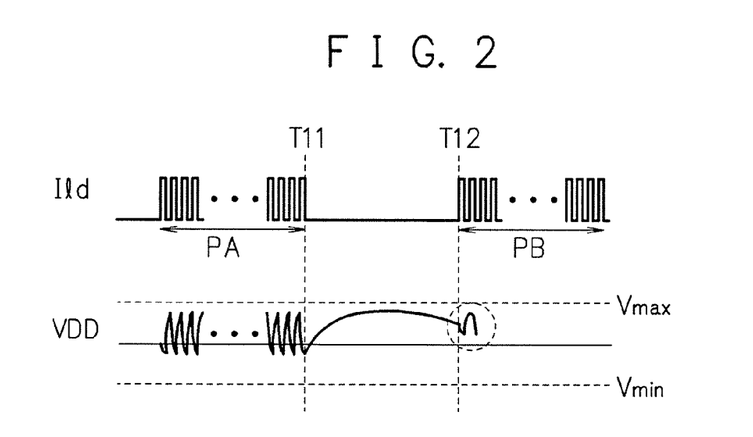
FIG. 2 is a waveform diagram illustrating an operation example of the power supply circuit according to the embodiment.

In the power supply circuit according to the present embodiment, it is possible to prevent that the output voltage VDD exceeds the upper limit value of the power supply voltage range in which the load 12 is able to operate even when, for example, the load 12 is a memory, and as illustrated in FIG. 2, writing and so on of data to the memory is repeatedly performed at a period PA, and thereafter, an interval period from times T11 to T12 is elapsed under a state in which the memory is not operated, and the writing and so on of data to the memory is repeatedly performed again at a period PB from the time T12. As illustrated in FIG. 2, the load current Ild is repeatedly generated in the period PA, the output voltage VDD is overshot when the load current Ild steeply disappears at the time T11 because a response of the power supply circuit by a feedback loop is late and the control of the output transistor TR1 delays. If the memory is operated again at the time T12 when the output voltage VDD is overshot and at the high position, the output voltage VDD exceeds the certain voltage in which the sensitivity adjustment part 15 of the anti-undershoot circuit 14 operates, and therefore, an increase amount to suppress the undershoot of the output voltage VDD resulting from the steep variation of the load current Ild is suppressed, and the output voltage VDD does not exceed an upper limit value Vmax of the power supply voltage range in which the load 12 is able to operate.

Figure 3:
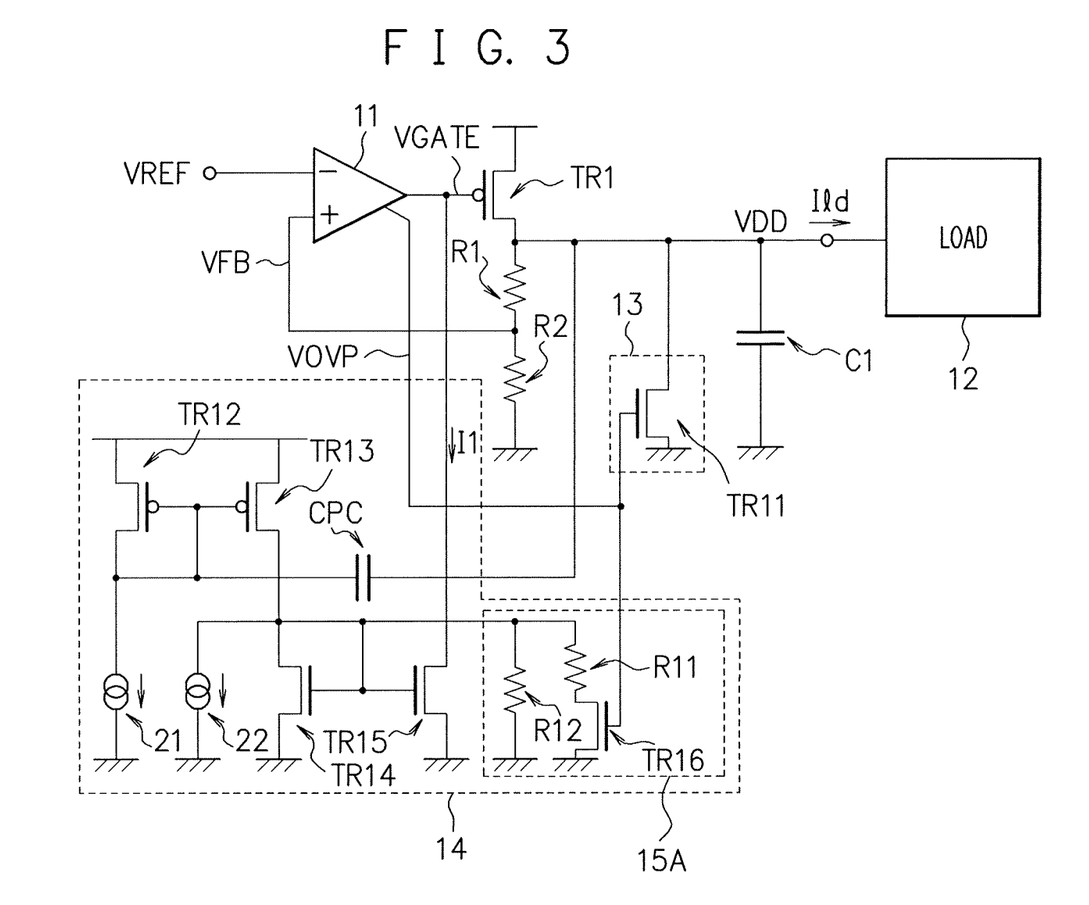
FIG. 3 is a view illustrating a circuit configuration example of the power supply circuit according to the embodiment.

FIG. 3 is a view illustrating a circuit configuration example of the power supply circuit according to the present embodiment. Note that in FIG. 3, components and so on having substantially the same functions as components and so on illustrated in FIG. 1 are designated the same reference numerals and symbols, and thereby duplicating explanations are not given.

The anti-overshoot circuit 13 is, for example, an N-channel transistor TR11. In the transistor TR11, a drain terminal is coupled to the output terminal of the power supply circuit, the ground voltage is supplied to a source terminal, and the second error signal VOVP is supplied to a gate terminal. In the transistor TR11, turning ON/OFF (continuity state/non-continuity state) is controlled in accordance with the second error signal VOVP supplied to the gate terminal, and a coupling between the output terminal of the power supply circuit and the ground voltage is controlled.

The anti-undershoot circuit 14 includes transistors TR12 to TR16, current sources 21, 22, resistances R11, R12, and the coupling capacitance CPC. In the P-channel transistor TR12, the power supply voltage is supplied to a source terminal, and a drain terminal and a gate terminal are coupled to one electrode of the coupling capacitance CPC. The output voltage VDD is input to the other electrode of the coupling capacitance CPC. The drain terminal of the P-channel transistor TR12 is coupled to the current source 21.

In the P-channel transistor TR13, the power supply voltage is supplied to a source terminal, a gate terminal is coupled to the one electrode of the coupling capacitance CPC, and a drain terminal is coupled to the current source 22. In the N-channel transistor TR14, the ground voltage is supplied to a source terminal, a drain terminal and a gate terminal are coupled to the drain terminal of the transistor TR13. In the N-channel transistor TR15, the ground voltage is supplied to a source terminal, a drain terminal is coupled to the gate terminal of the output transistor TR1, and a gate terminal is coupled to the gate terminal and the drain terminal of the transistor TR14. Namely, the transistor TR14 and the transistor TR15 are current-mirror coupled.

The drain terminal of the transistor TR14 is coupled to the ground voltage via the resistance R11 and the transistor TR16, and coupled to the ground voltage via the resistance R12. In the transistor TR16, the second error signal VOVP is supplied to a gate terminal. The resistances R11, R12, and the transistor TR16 make up a sensitivity adjustment part 15A.

The AC component of the output voltage VDD is input to the anti-undershoot circuit 14 illustrated in FIG. 3 via the coupling capacitance CPC. When the output voltage VDD steeply decreases, the current flowing in the transistors TR12, TR13 increases. The current increased in accordance with the AC component of the output voltage VDD flows in the transistor TR14, a first current (additional current) I1 is generated by current-mirroring the increased current by the transistor TR15, and the gate terminal of the output transistor TR1 is discharged to decrease the voltage VGATE. The output transistor TR1 is thereby controlled to raise the output voltage VDD when the output voltage VDD steeply decreases.

As stated above, the drain terminal of the transistor TR14 is coupled to the ground voltage via the resistance R11 and the transistor TR16, and coupled to the ground voltage via the resistance R12. When the DC level of the output voltage VDD does not exceed the certain voltage, the transistor TR16 is turned into the OFF state (non-continuity state) by the second error signal VOVP. On the other hand, when the DC level of the output voltage VDD exceeds the certain voltage, the transistor TR16 is turned into the ON state (continuity state) by the second error signal VOVP. Namely, when the DC level of the output voltage VDD exceeds the certain voltage, the resistance of the sensitivity adjustment part 15A becomes small and the current flowing in the resistance part increases compared to the case when the DC level of the output voltage VDD does not exceed the certain voltage, and therefore, the current flowing in the transistor TR14 decreases. The sensitivity of the anti-undershoot circuit 14 relative to the variation of the AC component of the output voltage VDD is thereby lowered and the increase amount of the output voltage VDD is suppressed when the DC level of the output voltage VDD exceeds the certain voltage.

Figure 4:
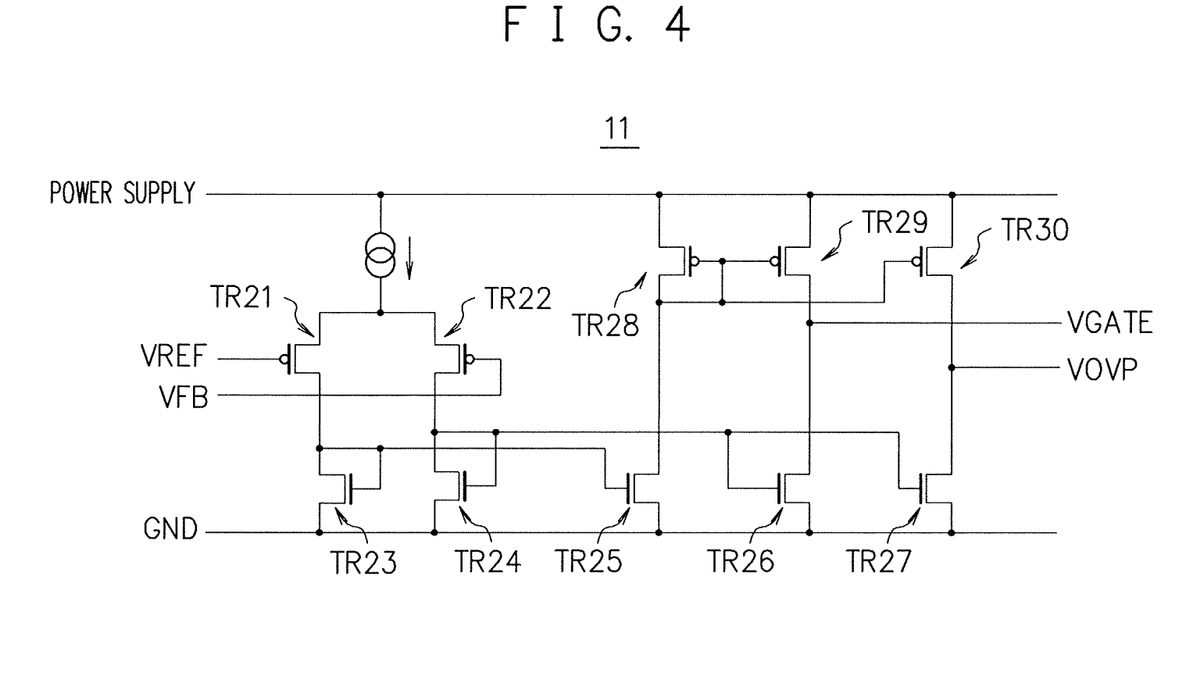
FIG. 4 is a view illustrating a circuit configuration example of an error amplifier according to the embodiment.

FIG. 4 is a view illustrating a circuit configuration example of the error amplifier 11 according to the present embodiment. In a P-channel transistor TR21, a source terminal is coupled to the power supply voltage via a current source, and the reference voltage VREF is input to a gate terminal. In a P-channel transistor TR22, a source terminal is coupled to the power supply voltage via the current source, and the divided voltage VFB is input to a gate terminal.

In an N-channel transistor TR23, the ground voltage is supplied to a source terminal, and a drain terminal and a gate terminal are coupled to the drain terminal of the P-channel transistor TR21. In an N-channel transistor TR24, the ground voltage is supplied to a source terminal, and a drain terminal and a gate terminal are coupled to the drain terminal of the P-channel transistor TR22. In an N-channel transistor TR25, the ground voltage is supplied to a source terminal, and a gate terminal is coupled to the drain terminal of the N-channel transistor TR23. In each of N-channel transistors TR26, TR27, the ground voltage is supplied to a source terminal, and a gate terminal is coupled to the drain terminal of the N-channel transistor TR24.

In a P-channel transistor TR28, the power supply voltage is supplied to a source terminal, and a drain terminal and a gate terminal are coupled to the drain terminal of the N-channel transistor TR25. In a P-channel transistor TR29, the power supply voltage is supplied to a source terminal, a drain terminal is coupled to a drain terminal of the N-channel transistor TR26, and a gate terminal is coupled to the drain terminal of the P-channel transistor TR28. In a P-channel transistor TR30, the power supply voltage is supplied to a source terminal, a drain terminal is coupled to the drain terminal of the N-channel transistor TR27, and a gate terminal is coupled to the drain terminal of the P-channel transistor TR28.

An electric potential at a coupling point between the drain terminal of the P-channel transistor TR29 and the drain terminal of the N-channel transistor TR26 is supplied to the gate terminal of the output transistor TR1. An electric potential at a coupling point between the drain terminal of the P-channel transistor TR30 and the drain terminal of the N-channel transistor TR27 is output as the second error signal VOVP. For example, when the divided voltage VFB increases, an electric potential at a coupling point between the drain terminal of the P-channel transistor TR22 and the drain terminal of the N-channel transistor TR24 decreases, and the second error signal VOVP being the electric potential at the coupling point between the drain terminal of the P-channel transistor TR30 and the drain terminal of the N-channel transistor TR27 increases. On the other hand, when the divided voltage VFB decreases, the electric potential at the coupling point between the drain terminal of the P-channel transistor TR22 and the drain terminal of the N-channel transistor TR24 increases, and the second error signal VOVP being the electric potential at the coupling point between the drain terminal of the P-channel transistor TR30 and the drain terminal of the N-channel transistor TR27 decreases.

Figure 5:
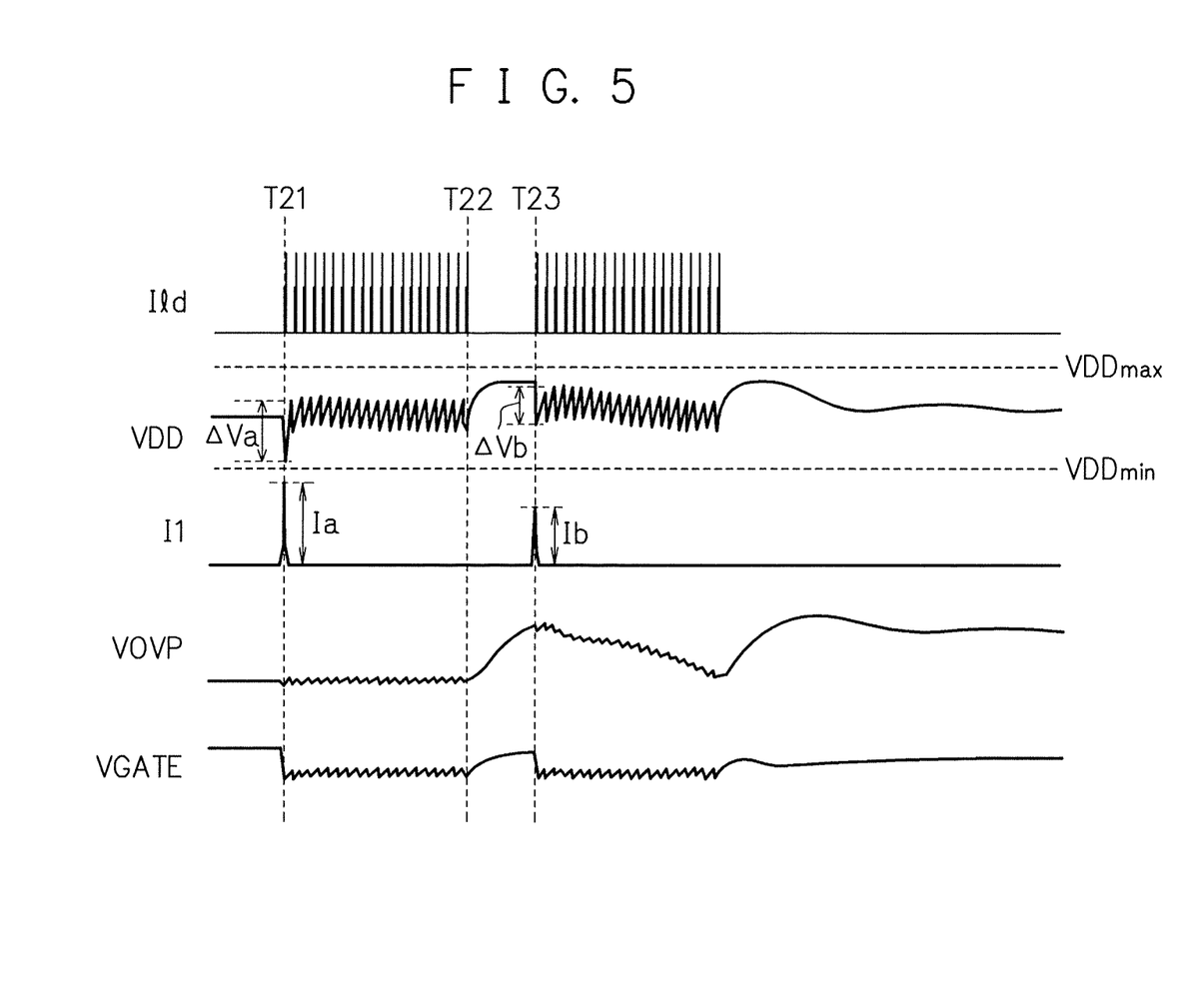
FIG. 5 is a waveform diagram illustrating an operation example of the power supply circuit according to the embodiment.

FIG. 5 is a waveform diagram illustrating an operation example of the power supply circuit according to the present embodiment. At time T21, the load 12 starts operation, and the load current Ild is repeatedly generated. At the time T21, the DC level of the output voltage VDD does not exceed the certain voltage, and therefore, a current Ia is supplied as the additional current I1, and the output voltage VDD is increased for ΔVa.

At time T22, when the operation of the load stops, the output voltage VDD is overshot and in a high state during an interval period of times T22 to T23, and a level of the second error signal VOVP becomes high. When the level of the second error signal VOVP exceeds a certain level, namely, when the output voltage VDD exceeds the certain voltage, the transistor TR16 of the sensitivity adjustment part 15A is in the ON-state. Under this state, when the load 12 starts the operation again at the time T23 and the load current Ild is repeatedly generated, the DC level of the output voltage VDD exceeds the certain voltage, and therefore, a current Ib smaller than the current Ia is supplied as the additional current I1, and the output voltage VDD is increased for ΔVb. As stated above, when the DC level of the output voltage VDD exceeds the certain voltage, the increase amount of the output voltage VDD relative to the steep variation of the output voltage VDD is suppressed.

Figure 6:
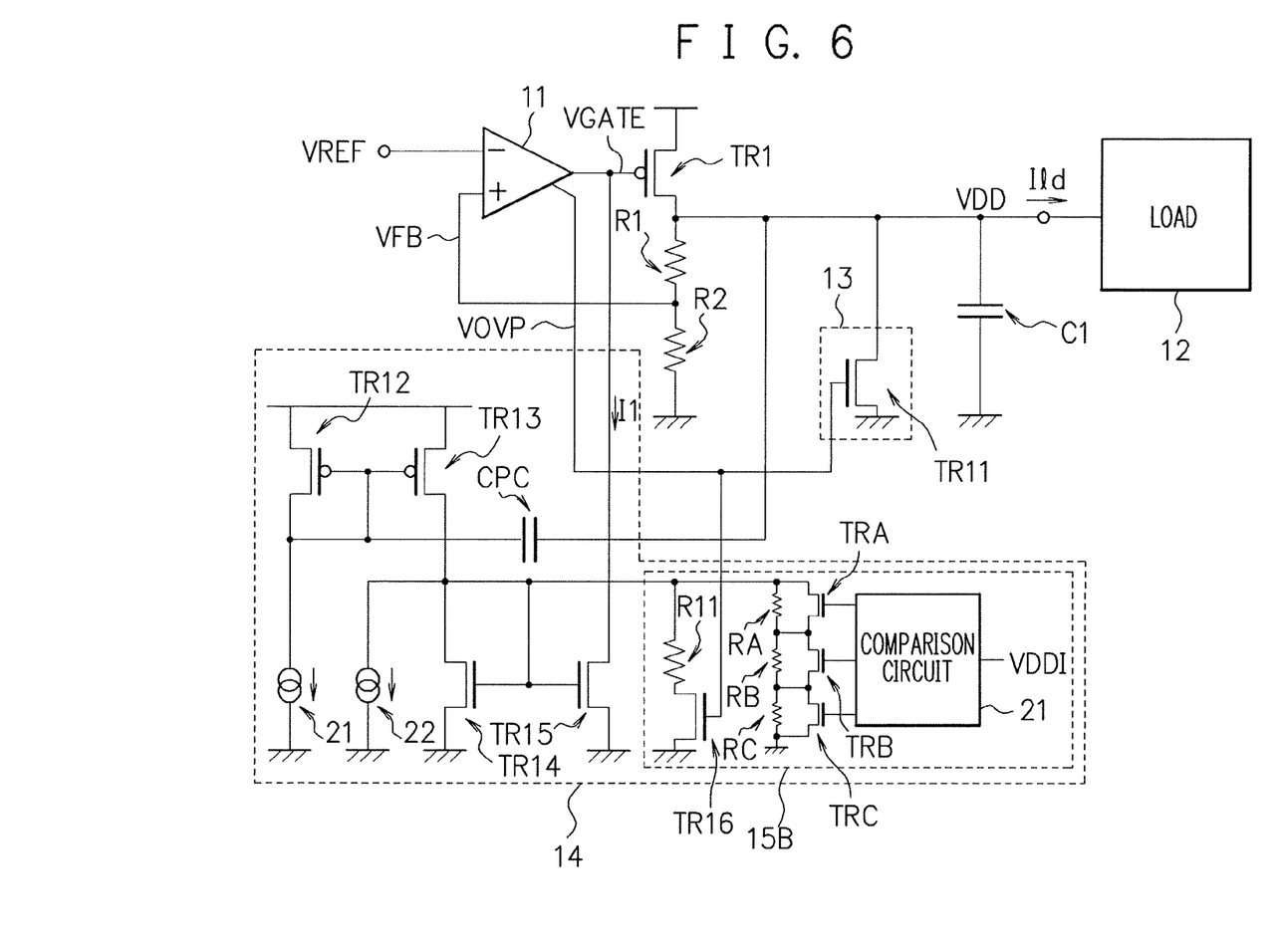
FIG. 6 is a view illustrating another circuit configuration example of the power supply circuit according to the embodiment.

FIG. 6 is a view illustrating another circuit configuration example of the power supply circuit according to the present embodiment. Note that in FIG. 6, components and so on having substantially the same functions as components and so on illustrated in FIG. 1, FIG. 3 are designated the same reference numerals and symbols, and thereby duplicating explanations are not given. In the power supply circuit illustrated in FIG. 6, a sensitivity adjustment part 15B is different from the power supply circuit illustrated in FIG. 3.

The sensitivity adjustment part 15B includes the resistance R11, the transistor TR16, and resistances RA, RB, RC, transistors TRA, TRB, TRC, and a comparison circuit 21. The resistances RA, RB, RC are coupled in series between the drain terminal of the transistor TR14 and the ground voltage. The transistor TRA is coupled in parallel to the resistance RA, the transistor TRB is coupled in parallel to the resistance RB, and the transistor TRC is coupled in parallel to the resistance RC. An output signal of the comparison circuit 21 is input to each of gate terminals of the transistors TRA, TRB, TRC.

The comparison circuit 21 compares an output voltage VDDI of the power supply circuit at an operation start time and one or more threshold voltages, and outputs the output signal in accordance with a comparison result to the gate terminals of the transistors TRA, TRB, TRC. Namely, the comparison circuit 21 performs an ON/OFF control of the transistors TRA, TRB, TRC in accordance with the output voltage VDDI of the power supply circuit at the operation start time. For example, when the DC level of the output voltage VDDI of the power supply circuit at the operation start time is higher than a threshold voltage to be a reference, the transistors TRA, TRB, TRC are controlled to make the resistance small, and lowers the sensitivity of the anti-undershoot circuit 14 relative to the variation of the AC component of the output voltage VDD. For example, when the DC level of the output voltage VDDI of the power supply circuit at the operation start time is lower than a threshold voltage to be the reference, the transistors TRA, TRB, TRC are controlled to make the resistance large, and raises the sensitivity of the anti-undershoot circuit 14 relative to the variation of the AC component of the output voltage VDD.

The sensitivity of the anti-undershoot circuit 14 relative to the variation of the AC component of the output voltage VDD is controlled in accordance with the output voltage VDDI of the power supply circuit at the operation start time as stated above, and thereby, it is possible to absorb dispersion of the reference voltage VREF resulting from dispersion and so on of the reference voltage circuit, and to more accurately control the sensitivity. Note that resistance values of the resistances RA, RB, RC may either be the same or different.

Figure 7A:
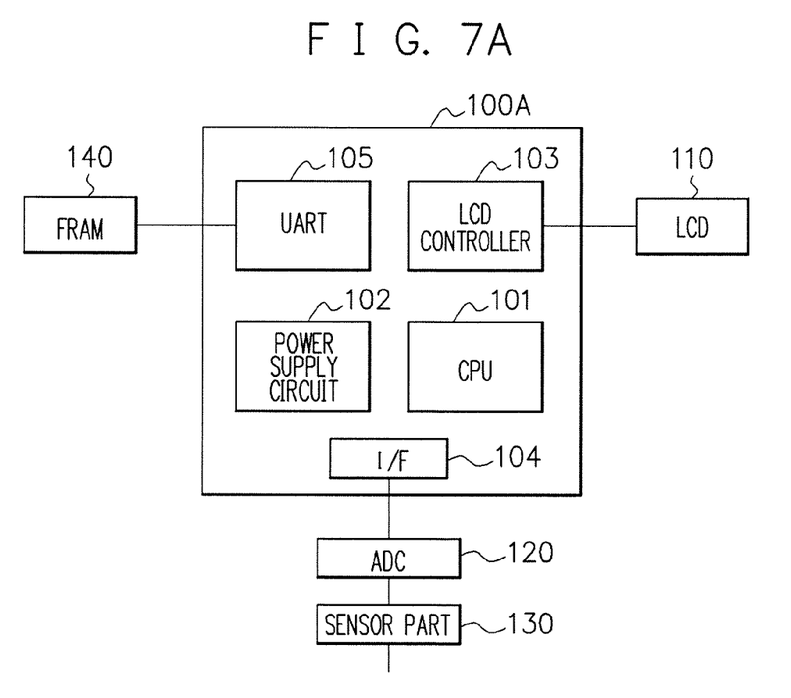
FIG. 7A and FIG. 7B are views illustrating configuration examples of semiconductor devices each including the power supply circuit according to the embodiment.
Figure 7B:
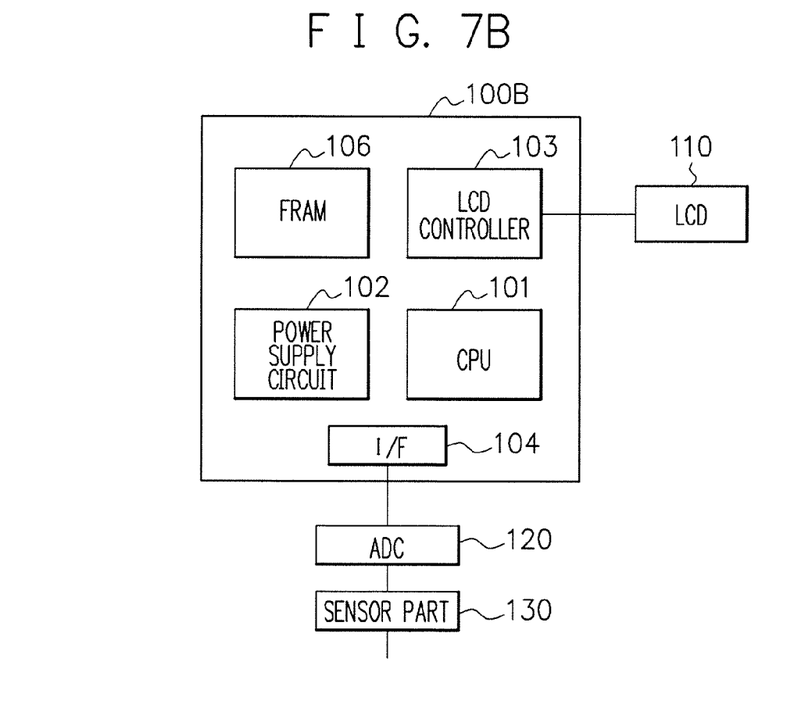

FIG. 7A and FIG. 7B are views illustrating configuration examples of semiconductor devices each including the power supply circuit according to the present embodiment. The semiconductor devices illustrated in FIG. 7A and FIG. 7B each include, for example, a function storing digital data obtained by converting a signal detected by a sensor part 130 to a memory by an analog digital converter (ADC) 120.

A semiconductor device 100A illustrated in FIG. 7A includes a CPU (Central Processing Unit) 101, a power supply circuit 102, an LCD (Liquid Crystal Display) controller 103, an interface part 104, and a UART (Universal Asynchronous Receiver Transmitter) 105. The CPU 101 controls respective function parts held by the semiconductor device 100A. The power supply circuit 102 is the power supply circuit according to the present embodiment, and supplies electric power to the function parts held by the semiconductor device 100A. The LCD controller 103 performs a display control relating to a display part 110. The display part 110 is, for example, a liquid crystal display device (LCD). The interface part 104 transmits/receives data with the ADC 120. The UART 105 is a serial interface to perform writing of data to an external memory 140 and reading of data from the external memory 140. The external memory 140 is, for example, a ferroelectric memory (FRAM). Note that in the semiconductor device 100A illustrated in FIG. 7A, the memory 140 is externally held, but the memory 140 may be held in a semiconductor device 100B as illustrated in FIG. 7B.

According to a disclosed power supply circuit, it becomes possible to surely keep an output voltage within a power supply voltage range in which a load is able to operate by decreasing a current output to a gate terminal of a first transistor in accordance with an AC component of the output voltage when the output voltage is higher than a certain voltage.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power supply circuit, comprising:
a first transistor coupled between an input terminal where an input voltage is input and an output terminal where an output voltage is output;
an error amplifier configured to generate a first error signal and a second error signal based on a difference voltage between a voltage in accordance with the output voltage and a reference voltage, and to output the first error signal to a gate terminal of the first transistor;
a control circuit configured to add a control signal based on a first current in accordance with an AC component of the output voltage to the first error signal; and
an adjustment circuit configured to decrease the first current based on the second error signal when the output voltage is higher than a certain voltage.

2. The power supply circuit according to claim 1, wherein the adjustment circuit includes a resistance part coupled to a node where the first current flows and whose resistance value is controlled based on the second error signal.

3. The power supply circuit according to claim 2, wherein the resistance part includes:
a first resistance part and a second resistance part,
wherein the first resistance part and the second resistance part are coupled to the node where the first current flows in parallel when the output voltage is higher than the predetermined voltage, and the first resistance part is coupled to the node where the first current flows when the output voltage is the predetermined voltage or less.

4. The power supply circuit according to claim 3, wherein the first resistance part includes a first resistance coupled to the node where the first current flows, and
the second resistance part includes a series circuit coupled to the node where the first current flows, and
the series circuit includes a third transistor in which the second error signal is supplied to a gate terminal and a second resistance coupled in series.

5. The power supply circuit according to claim 3, wherein a resistance value of the first resistance part is controlled based on the output voltage of the power supply circuit at an operation start time.

6. The power supply circuit according to claim 5, wherein the first resistance part includes:
plural resistances coupled to the node where the first current flows; and
a comparison circuit configured to compare the output voltage of the power supply circuit at the operation start time and one or more threshold voltages, and to switch whether or not each of the resistances are coupled to the node where the first current flows in accordance with a comparison result.

7. A semiconductor device, comprising:
a load; and
a power supply circuit configured to supply electric power to the load,
wherein the power supply circuit including:
a first transistor coupled between an input terminal where an input voltage is input and an output terminal where an output voltage is output;
an error amplifier configured to generate a first error signal and a second error signal based on a difference voltage between a voltage in accordance with the output voltage and a reference voltage, and to output the first error signal to a gate terminal of the first transistor;
a control circuit configured to add a control signal based on a first current in accordance with an AC component of the output voltage to the first error signal; and
an adjustment circuit configured to decrease the first current based on the second error signal when the output voltage is higher than a certain voltage.

8. The semiconductor device according to claim 7, wherein the load is a memory.

9. The semiconductor device according to claim 7, wherein the load is a microcontroller.

* * * * *